(12) United States Patent
Ametani

(10) Patent No.: US 7,740,728 B2
(45) Date of Patent: Jun. 22, 2010

(54) FILM SEPARATION METHOD AND FILM SEPARATION APPARATUS

(75) Inventor: Minoru Ametani, Mitaka (JP)

(73) Assignee: Tokyo Seimitsu Co., Ltd., Mitaka-shi (JP)

( * ) Notice: Subject to any disclaimer, the term of this patent is extended or adjusted under 35 U.S.C. 154(b) by 984 days.

(21) Appl. No.: 11/491,426

(22) Filed: Jul. 21, 2006

(65) Prior Publication Data

US 2007/0026641 A1    Feb. 1, 2007

(30) Foreign Application Priority Data

Jul. 29, 2005    (JP)    ............... 2005-220750

(51) Int. Cl.
*B32B 37/00* (2006.01)

(52) U.S. Cl. ............... 156/228; 156/247; 156/344; 156/581; 156/583.1; 156/584

(58) Field of Classification Search ............. 156/228, 156/344, 555, 580, 581, 582, 583.1, 584, 156/247

See application file for complete search history.

(56) References Cited

U.S. PATENT DOCUMENTS

| | | | |
|---|---|---|---|
| 6,129,811 A | | 10/2000 | McKenna et al. |
| 2001/0017189 A1* | | 8/2001 | Tsujimoto et al. ........... 156/344 |
| 2002/0187589 A1 | | 12/2002 | Tsujimoto |
| 2003/0092288 A1* | | 5/2003 | Yamamoto et al. .......... 438/800 |

FOREIGN PATENT DOCUMENTS

| | | |
|---|---|---|
| EP | 0 886 299 A2 | 12/1998 |
| EP | 1 128 415 A2 | 8/2001 |
| EP | 0 886 299 A3 | 9/2003 |
| EP | 1 484 786 A2 | 12/2004 |
| EP | 1 128 415 A3 | 5/2006 |

(Continued)

OTHER PUBLICATIONS

Patent Abstracts of Japan, with Machine Translation of Application, Publication No. 11-016862; Date of Publication: Jan. 22, 1999; in the name of Masaki Tsujimoto et al.

(Continued)

*Primary Examiner*—James Sells
(74) *Attorney, Agent, or Firm*—Christie, Parker & Hale, LLP.

(57) ABSTRACT

A film separation apparatus (100) for separating a film (110) attached to a film application surface of a wafer (120) comprises a wafer adsorption unit (31) for adsorbing the wafer with the film application surface up, a release tape supply unit (42) for supplying the release tape (3) onto the film application surface, and a heating unit (80) for pressing and heating only a part of the release tape against the wafer film at an edge of the wafer. Thus, the adhesion between the release tape and the film is increased at the particular part of the release tape. The apparatus further comprises a peeling unit (44) for separating the film from the film application surface of the wafer using a release tape with a part of the release tape having an improved adhesion as a separation starting point. Thus, the surface protective film can be easily separated from the wafer.

8 Claims, 12 Drawing Sheets

FOREIGN PATENT DOCUMENTS

| | | |
|---|---|---|
| EP | 1 484 786 A3 | 6/2006 |
| JP | 11-16862 | 1/1999 |
| JP | 2003-045904 | 2/2003 |
| JP | 2004-071687 | 3/2004 |
| JP | 2004-128147 | 4/2004 |
| JP | 2004-165570 | 6/2004 |
| KR | 1999-007148 | 1/1999 |
| KR | 2001-0097792 | 11/2001 |

OTHER PUBLICATIONS

Office action, with English translation, dated Jan. 18, 2008, for corresponding Korean Patent Application No. 10-2006-0071707, indicating the relevance of KR 1999-007148.

Search Report dated Apr. 21, 2008 for corresponding European Patent Application No. 06117386.0, indicating the relevance of the cited references.

Patent Abstracts of Japan and English machine translation of JP 2003-045904 listed above.

Patent Abstracts of Japan and English machine translation of JP 2004-071687 listed above.

Patent Abstracts of Japan, Publication No. 2004128147 A, Published on Apr. 22, 2004, in the name of Yamamoto.

Patent Abstracts of Japan, Publication No. 2004165570 A, Published on Jun. 10, 2004, in the name of Yamamoto.

* cited by examiner

FILM SEPARATION METHOD AND FILM SEPARATION APPARATUS

CROSS-REFERENCE TO RELATED APPLICATION

This application claims priority of Japanese Patent Application Number 2005-220750, filed on Jul. 29, 2005.

BACKGROUND OF THE INVENTION

1. Field of the Invention

This invention relates to a film separation method, for separating a film such as a surface protective film attached to the front surface of a wafer, and a film separation apparatus for carrying out the method.

2. Description of the Related Art

In a semiconductor fabrication process, a wafer size has been increased and, to improve the package density, the wafer thickness has been decreased. In order to reduce the thickness of the wafer, a surface protective film is attached on the front surface of a wafer formed with semiconductor devices, and the back surface of the wafer is ground, in what is called a back-grind process, with the wafer surface adsorbed to an adsorption table.

This back-grind process reduces the wafer thickness to, for example, 50 micrometers. Therefore, the mechanical strength of the wafer after the back-grind process is correspondingly reduced. The surface protective film described above must be separated after the back-grind process. According to the prior art, a release tape is attached over the whole of the surface protective film of the wafer, by an application roller, and is rolled off together with the surface protective film thereby to separate the surface protective film. In view of the fact that the mechanical strength of the wafer is greatly reduced, however, a problem is posed that the wafer is often broken when the release tape is attached to the surface protective film.

In order to solve this problem, Japanese Unexamined Patent Publication No. 2004-165570 discloses a method in which the direction of the wafer is adjusted in such a manner that the direction of the release tape fails to coincide with the dicing grooves formed on the wafer. Also, Japanese Unexamined Patent Publication No. 2004-128147 discloses a separation apparatus in which the separation is started from a corner or edge of the wafer.

FIG. 12 is an enlarged sectional view of a wafer, with a surface protective film attached thereon, and indicates that the thickness D0 of the wafer 120 is reduced to D1. As can be understood from FIG. 12, the edge portion 125 of the wafer 120 is chamfered in advance. In order to improve the adhesion by eliminating the gap between the surface protective film 110 and the wafer 120 while at the same time preventing the diameter of the surface protective film from being increased in diameter beyond the wafer size after the back-grind process, what is called an angle-cut process has recently been sometimes executed to cut off the surface protective film 110 in the direction of arrow Z along the chamfered portion of the wafer 120 after the surface protective film 110 is attached.

As shown in FIG. 12, the surface protective film 110, attached on the front surface 121 of the wafer 120 before the back grind process, is configured of a protective film base member 111 and a protective film adhesive layer 112. After executing the angle cut process described above, therefore, the protective film base member 111 of the surface protective film 110 is reduced to a size smaller than the surface 121 of the wafer 120. In such a case, it is difficult to separate the surface protective film 110 in its entirety after the back grind process by simply adjusting or selecting the direction of the wafer 120 or a separation starting point as described in Japanese Unexamined Patent Publication No. 2004-165570 or No. 2004-128147.

Also, the adhesion performance of the release tape changes with the characteristic of the surface protective film constituting an object to be bonded or the specific process executed on the surface protective film after being attached to the wafer. Thus, it may become difficult to attach the release tape to a specific surface protective film or to a surface protective film subjected to a specific process after being attached.

The present invention has been developed in view of this situation, and the object thereof is to provide a film separation method, and a film separation apparatus for carrying out the method, in which even in the case where the surface protective film is cut off along the chamfered portion of the wafer or in the case of a specific surface protective film or a surface protective film subjected to a specific process, the release tape can be easily integrated with the surface protective film and easily separated together with the surface protective film.

SUMMARY OF THE INVENTION

In order to achieve the object described above, according to a first aspect of the invention, there is provided a film separation apparatus, for separating the film attached to a film application surface of a wafer, comprising a wafer adsorption means for adsorbing the wafer in such a manner that the film application surface of the wafer constitutes an upper surface, a release tape supply means for supplying the release tape onto the film on the film application surface, and a heating means for pressing and heating only a part and/or a plurality of parts of the release tape at the edge portion of the wafer against the film thereby to improve the adhesion between the release tape and the film at the part and/or the plurality of the parts of the release tape, and a separation means for separating the film from the film application surface of the wafer using the release tape with the part or the parts of the release tape improved in adhesion as a separation start point.

Specifically, in the first aspect of the invention, the release tape is heated by the heating means while the release tape is pressed against the film thereby to form a portion having an improved adhesion between the release tape and the film. The release tape, which may fail to be sufficiently bonded to a specific film or the like, can be attached to the film. Further, the portion with an improved adhesion functions as a separation starting point. Even in the case where the film is cut off along the chamfered portion of the wafer, therefore, the film can be easily separated from the wafer together with the release tape. Incidentally, the release tape used is preferably a heat sensitive release tape.

According to a second aspect of the invention, there is provided a film separation apparatus according to the first aspect, wherein the heat press units for pressing the release tape against the film in the heating means have a circular or arcuate cross section.

Specifically, in the second aspect, the heat press units of the heating means are positioned in such a manner that the circular cross section or the arcuate cross section is inscribed in the wafer. Thus, the separation starting point can be formed at the outermost edge of the wafer without heating an unrequired portion. Incidentally, the cross section of the heat press unit may be a rectangle or any shape other than a circle or arc.

According to a third aspect of the invention, there is provided a film separation apparatus based on the first or second aspect, wherein the separation means includes an edge member brought into contact with the wafer via the release tape.

Specifically, in the third aspect, the film separation apparatus according to the invention can be formed with a comparatively simple configuration.

According to a fourth aspect of the invention, there is provided a film separation apparatus based on the first aspect, wherein the separation means includes an edge member brought into contact with the wafer via the release tape, and the heating means is built in the edge member of the separation means.

Specifically, in the fourth aspect, the heating means and the separation means are integrated with each other and, therefore, the film separation apparatus can be reduced in size, as a whole.

According to a fifth aspect of the invention, there is provided a film separation apparatus based on the first aspect, wherein the heating means includes a pressure roller capable of heating the release tape and adapted to move substantially transversely to the release tape, and the aforementioned part of the release tape is heated by the pressure roller moving over the part.

Specifically, in the fifth aspect, the use of the pressure roller makes it possible to easily press and heat only a desired part of the release tape by moving the pressure roller. Also, by reciprocating the pressure roller several times over the desired position, the adhesion between the release tape and the film can be further increased.

According to a sixth aspect of the invention, there is provided a film separation apparatus based on the fifth aspect, wherein the heating means includes a rotatable disk, the pressure roller is mounted on the lower surface of the rotatable disk in such a manner that the rotational axis of the pressure roller is located on the radius of the rotatable disk, and the pressure roller is rotationally moved along an arc on the release tape at the time of rotation of the rotatable disk.

Specifically, in the sixth aspect, the desired part of the release tape alone can be very easily pressed and heated simply by rotating the rotatable disk, so that the adhesion between the release tape and the film can be positively increased. Also, the pressure roller may be moved in radial direction of the rotatable disk with the rotation center set at the wafer center. In this case, the edge portion of a wafer, even if different in size, can be easily pressed by moving the pressure roller in radial direction.

According to a seventh aspect of the invention, there is provided a film separation method for separating the film attached on the film application surface of a wafer, wherein the wafer is arranged on a wafer adsorption means in such a manner that the film application surface of the wafer constitutes an upper surface, the release tape is supplied onto the film on the film application surface, a part of the release tape is heated while being pressed against the film of the wafer by a heating-means thereby to improve the adhesion between the release tape and the film at the particular part of the release tape, and the film is separated from the film application surface of the wafer by the release tape with the particular part of the release tape with an improved adhesion as a separation starting point.

Specifically, in the seventh aspect, a portion with an improved adhesion between the release tape and the film is formed by the heating means pressing the release tape against the film. Even in the case the release tape fails to be sufficiently bonded to a specific film, the release tape can be attached to the film. Further, the portion with an improved adhesion functions as a separation starting point and, therefore, even in the case where the film is cut off along a chamfered portion of the wafer, the film can be easily separated from the wafer together with the release tape. Incidentally, the release tape is preferably a heat sensitive release tape.

According to an eighth aspect of the invention, there is provided a film separation method based on the seventh aspect, wherein the release tape is formed only of a plastic material.

According to a ninth aspect of the invention, there is provided a film separation method based on the eighth aspect, wherein the plastic material is formed of one or a plurality of materials selected from polyethylene, polypropylene, polyvinyl chloride and polystyrene.

Specifically, in the eighth and ninth aspects, a tape or a film formed of a comparatively inexpensive plastic material is used without a heat sensitive release tape and, therefore, the running cost of the film separation apparatus can be suppressed. Incidentally, the softening point of these plastic materials is preferably lower than about 100° C., so that the heating means can be set to a comparatively low temperature.

The above and other objects, features and advantages of the invention will be made apparent by the detailed description of typical embodiments of the invention shown in the accompanying drawings.

BRIEF DESCRIPTION OF THE DRAWINGS

FIG. 5b is a partly enlarged view showing the operation of the film separation apparatus shown in FIG. 5a.

FIG. 6b is a partial top plan view of the film separation apparatus shown in FIG. 6a.

DESCRIPTION OF THE PREFERRED EMBODIMENTS

Figure 1:
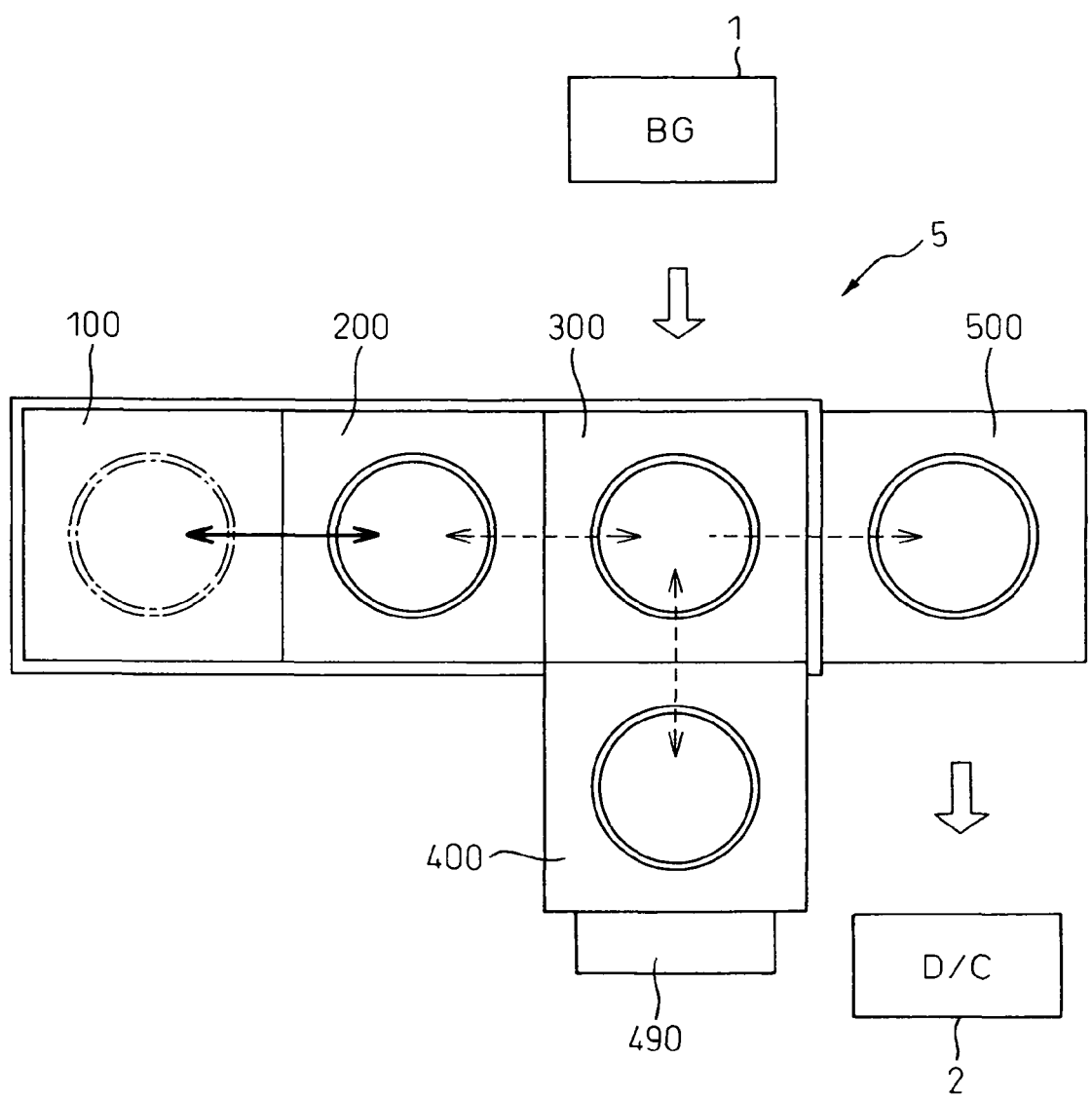
FIG. 1 is a schematic diagram showing a wafer processing system according to the invention.

Embodiments of the invention are explained below with reference to the accompanying drawings. In the drawings, the same component members are designated by the same reference numerals, respectively. To facilitate understanding, the scale of the drawings is changed appropriately.

FIG. 1 is a schematic diagram showing a wafer processing system according to the invention. As shown in FIG. 1, a wafer with the back surface thereof ground and reduced in thickness by a back grinder (BG) 1 is supplied to the wafer processing system 5, as shown in FIG. 1. In grinding the back of the wafer, the semiconductor chip formed on the front surface of the wafer is required to be protected, and therefore a surface protective film 110 is attached on the front surface of a wafer 120 supplied to the wafer processing system 5.

As shown in FIG. 1, the wafer processing system 5 includes an inversion unit 300 for inverting the wafer 120. The wafer 120, with the surface protective film 110 attached on the front surface thereof and the back surface thereof ground by the back grinder 1, is supplied into the inversion unit 300 by a loader, not shown. The back surface of the wafer 120 is directed upward while being ground by the back grinder 1. The wafer 120 supplied to the inversion unit 300, therefore, has the back surface thereof up. In the inversion unit 300, this wafer 120 is vertically inverted, and the front surface of the wafer 120 with the surface protective film 110 attached thereon is directed upward. As described later, the wafer 120 can alternatively be simply passed through the inversion unit 300 without being inverted.

The adhesion of some types of surface protective film 110 is reduced by irradiation with a predetermined amount of ultraviolet light thereon. In the case where such a surface protective film 110 is employed, an ultraviolet light radiation unit 400 can be used with the wafer processing system 5 shown in FIG. 1. The wafer 120 is supplied to the UV radiation unit 400 while the front surface thereof with the protective film 110 attached thereon is located upward. Therefore, after a predetermined amount of ultraviolet light is irradiated onto the surface protective film 110 by a UV lamp 490, the wafer 120 is returned to the inversion unit 300. To move the wafer 120 in this way, a moving device such a robot arm is used. Such a device is an ordinary one and, therefore, is neither illustrated nor described. In the case where a surface protective film 110 with the adhesion thereof remaining unchanged upon radiation of the ultraviolet light thereon is used, the wafer 120 is not required to be supplied to the UV radiation unit 400, and the process which otherwise might be executed in the UV radiation unit 400 is omitted.

Next, the wafer 120 is supplied to a positioning unit 200 from the inversion unit 300. The positioning unit 200 has a circular absorption table 31 (not shown in FIG. 1) for adsorbing the wafer 120. This adsorption table 31 is formed of a porous ceramic or the like and is connected to a vacuum source not shown. The diameter of the adsorption table 31 is substantially equal to or larger than the diameter of the wafer 120 to be adsorbed. The positioning unit 200 includes a positioning sensor (not shown) above the adsorption table 31. By using the positioning sensor, the wafer 120 is set in position, concentrically and accurately, on the adsorption table 31. Then, the vacuum source is driven, so that the wafer 120 is accurately adsorbed to the adsorption table 31 with the surface protective film 110 upward.

Figure 2:
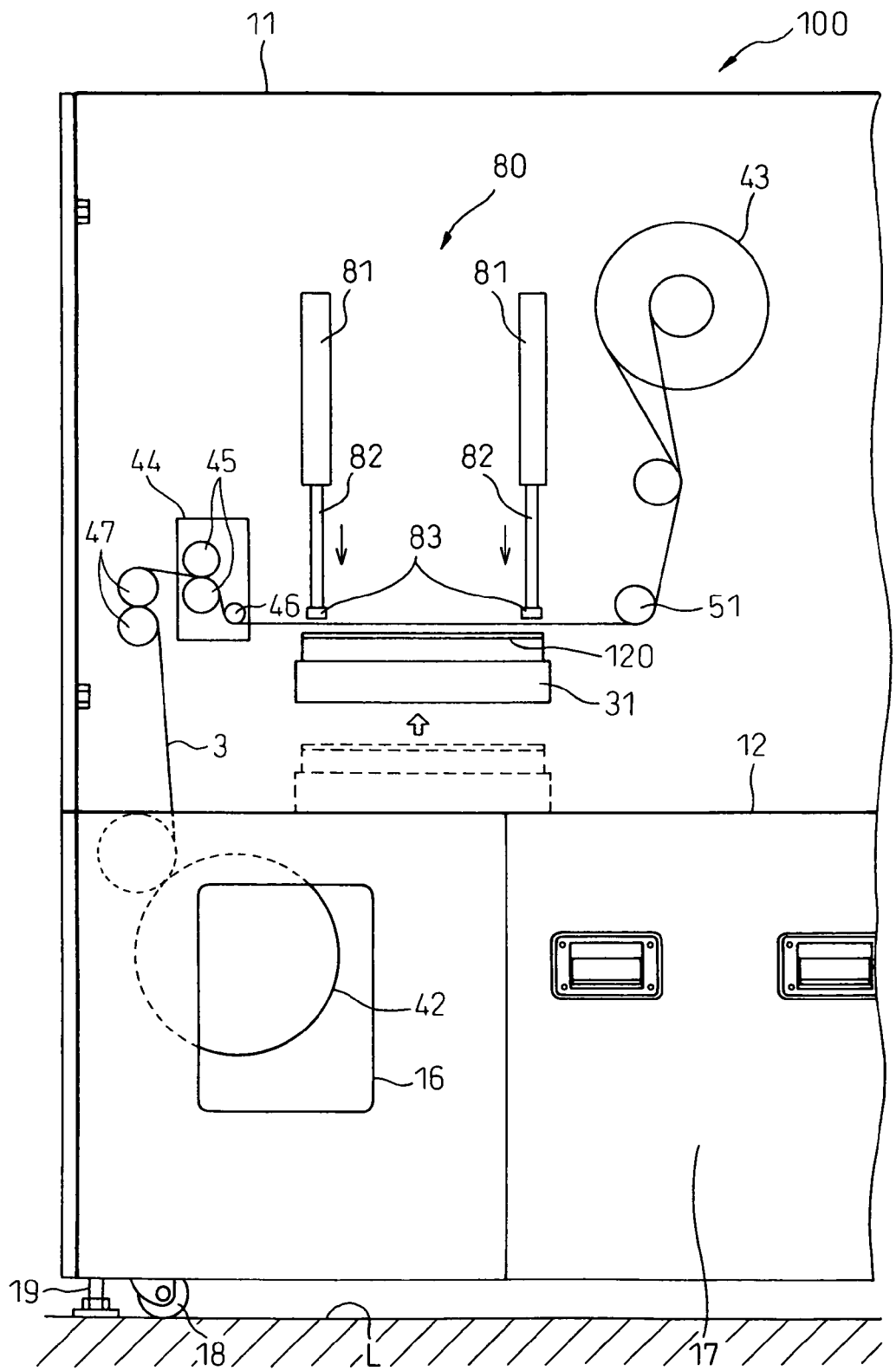
FIG. 2 is a side view showing a film separation apparatus according to a first embodiment of the invention.

After that, the adsorption table 31, with the wafer 120 adsorbed thereto, is transferred from the positioning unit 200 to a separation unit 100. FIG. 2 is a side view showing a separation unit 100 constituting a film separation apparatus according to the invention, which will be explained below with reference to FIG. 2.

The film separation apparatus 100 shown in FIG. 2 includes a supply unit 42 for supplying the release tape 3 into a housing 11, and a take-up unit 43 for taking up the tape from the supply unit 42. The release tape 3 used in the film separation apparatus 100 is for separating the surface protective film 110 attached to the front surface of the wafer 120. The width of the release tape 3 is smaller than the diameter of the wafer 120 and, according to this embodiment, is substantially one half of the diameter of the wafer 120. In this embodiment, the release tape 3 may be a heat sensitive release tape exhibiting the bonding power after being heated.

A plurality of castors 18 and a plurality of stoppers 19 (one each is shown in FIG. 2) are arranged on the bottom surface of the housing 11. The tape separation apparatus 100 can be moved to the desired position on the floor L by the castors 18 and can be fixed at the particular position by the stoppers 19. Also, doors 17 are provided in the lower part of the tape separation apparatus 100. By opening the doors 17, a control unit 89 such as a digital computer, not shown, arranged in the lower part of the film separation apparatus 100 can be accessed. The control unit 89 is for controlling each member of the film separation apparatus 100.

As shown in FIG. 2, a pair of guide rollers 47, for guiding the release tape 3 while applying a predetermined tension to the release tape 3, are arranged downstream of the supply unit 42. Further, a peeling unit 44 is arranged downstream of the guide rollers 47 and upstream of the adsorption table 31. As can be understood from FIG. 2, the peeling unit 44 includes a pair of rollers 45 and a peeling roller 46 located immediately downstream of the rollers 45. The peeling roller 46 is larger than the maximum width of the adsorption table 31.

Though not shown, a part of the peeling unit 44 is connected to an endless chain suspended on two pulleys, for example, which are connected to a motor, not shown. The whole of the peeling unit 44 can be reciprocated horizontally between the pulleys by driving the motor in forward and reverse directions. The peeling unit 44 may, of course, alternatively be reciprocated in horizontal direction by another drive mechanism. As described in detail later, the peeling unit 44 is moved horizontally along the diameter of the wafer 120 from one end to the other of the wafer 120, so that the release tape 3 can be separated from the surface of the wafer 120. A guide roller 51 for guiding the release tape 3 and a take-up unit 43 for taking up the release tape 3 are arranged downstream of the peeling unit 44. The release tape 3 is supplied from the supply unit 42 and located above the adsorption table 31.

As shown in FIG. 2, a rack 12 is arranged in the intermediate portion of the film separation apparatus 100. The adsorption table 31 that has adsorbed the wafer 120 in the positioning unit 200 is slid on the rack 12 and proceeds into the area of the film separation apparatus 100. Though not described in detail, the adsorption table 31 that has proceeded to a predetermined position in the film separation apparatus 100 is adapted to move up or down at the particular position. According to this invention, therefore, the surface protective film 110 can be separated without rearranging, on another table, the wafer 120 accurately set in position on the adsorption table 31 in the positioning unit 200.

According to the embodiment shown in FIGS. 1, 2, the adsorption table 31 can be slid between the separation unit 100 and the positioning unit 200. Nevertheless, the adsorption table of the separation unit 100 may be formed as a member independent of the positioning unit 200.

As shown in FIG. 2, a heating unit 80 is arranged above the adsorption table 31 in the housing 11. As shown in FIG. 2, the heating unit 80 includes two juxtaposed vertical cylinders 81. A plunger 82 extending from the lower end of each of these cylinders 81 can be driven reciprocally in the corresponding cylinder 81. Heat press units 83 for pressing and heating the release tape 3 against the surface protective film 110 of the wafer 120 are arranged at the forward end of the respective plungers 82. An electrically heated wire (not shown) arranged in each heat press unit 83 is connected to a controller (not shown) in the cylinder 81 through each plunger 82. While the separation unit 100 is in operation, the heat press units 83 are heated by the controller to a temperature of about 100° C., for example, required for the release tape 3 to exhibit the bonding power.

In FIG. 2, the adsorption table 31 transferred from the positioning unit 200 to the separation unit 100 over the rack 12 stops under the heating unit 80 (indicated by dotted line in FIG. 2). Then, the total thickness t of the wafer 120 and the surface protective film 110 is measured by a thickness sensor not shown in FIG. 2. The wafer 120 has the back surface thereof ground to varying degrees depending on a particular lot. The thickness of the wafer 120, therefore, varies from one lot to another. The total thickness t measured by the thickness sensor is supplied to the control unit 89.

After that, the adsorption table 31 is moved up toward the release tape 3 under the heating unit 80 by a well known means, not shown (FIG. 2). The distance between the release tape 3 located under the heating unit 80 and the rack 12 is known, and therefore, the surface protective film 110 of the wafer 120 and the release tape 3 are brought into slight contact (soft contact) with each other by considering of the total thickness t. In this way, the surface protective film 110 is brought into slight contact with the release tape 3, so that the release tape 3 comes into contact only with the surface protective film 110 but remains out of contact with the adsorption table 31, or especially, the upper surface edge portion of the adsorption table 31 having the adsorption function. According to this invention, therefore, the adhesive of the release tape 3 does not intrude into the holes in the upper surface of the adsorption table 31 and an adsorption failure, of the wafer 120, is avoided. Especially, according to this invention, the adsorption table 31 is moved up taking the total thickness t of the surface protective film 110 and the wafer 120 into consideration and, therefore, an adsorption failure of the wafer 120 can be positively avoided.

Before the heating unit 80 is driven, the release tape 3 and the surface protective film 110 are simply in contact with each other, and sufficient adhesion is not developed between the release tape 3 and the surface protective film 110. Before driving the heating unit 80, therefore, the adhesion between the release tape 3 and the surface protective film 110 is smaller than that between the surface protective film 110 and the wafer 120 and that between the wafer 120 and the adsorption table 31. In other words, in the case where the release tape 3 is taken up under this condition, only the release tape 3 would be taken up while the surface protective film 110 remained attached on the wafer 120.

Thus, the heating unit 80 is activated while the release tape 3 and the surface protective film 110 are in slight contact with each other. The plunger 82 of the heating unit 80 is extended downward by driving an actuator not shown. The plunger 82 is extended to a predetermined length (FIG. 2), so that the heat press units 83 for pressing and heating the release tape 3 against the surface protective film 110.

Figure 3A:
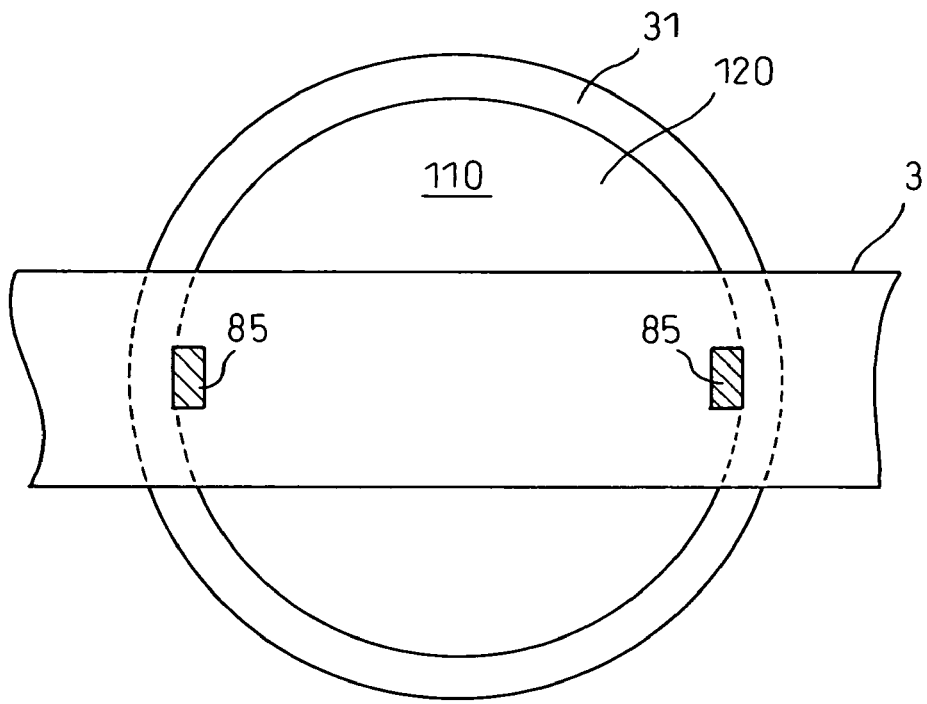
FIG. 3a is a plan view of a wafer showing the heating points formed by a heating member.

FIG. 3a is a plan view showing a wafer and heating points formed by the heat press units 83 when the heating unit 80 is activated. In FIG. 3a, the edge portions of the wafer 120 are formed with the heating points 85 by the heat press units 83 on the release tape 3. In FIG. 3a, the heat press units 83 having a rectangular cross section are used and therefore rectangular heating points 85 are shown.

The heating points 85 are formed under the pressing operation applied by the heat press units 83. As the release tape 3 is of heat sensitive type, the adhesion between the release tape 3 and the surface protective film 110 is increased at the heating points 85. Specifically, after the heating unit 80 has been activated, the adhesion between the release tape 3 and the surface protective film 110 at the heating points 85 is increased beyond the adhesion between the surface protective film 110 and the wafer 120. The adhesion between the release tape 3 and the surface protective film 110, however, is not larger than the adsorption strength between the wafer 120 and the adsorption table 31. The peeling unit 44 is driven after the adhesion increased in this way between the release tape 3 and the surface protective film 110 at the heating points 85.

Figure 4A:
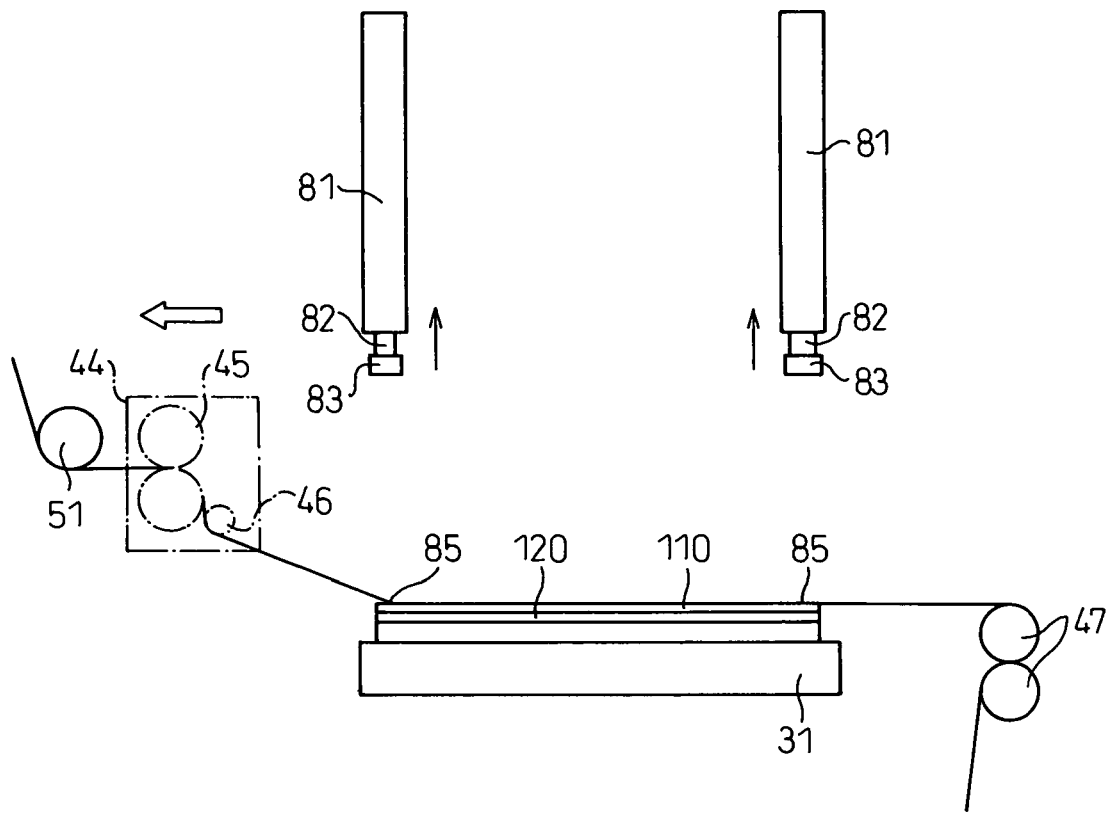
FIG. 4a is an enlarged side view showing a film separation apparatus.
Figure 4B:
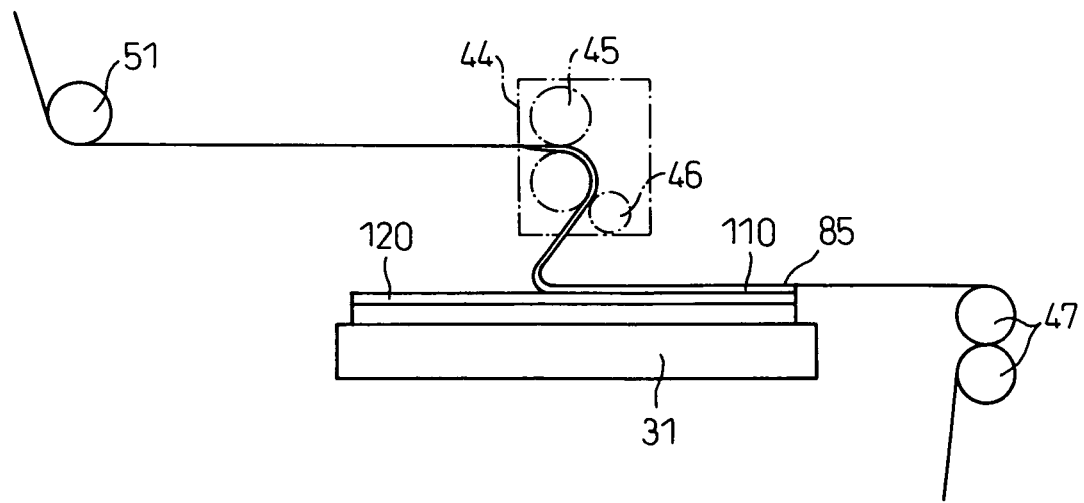
FIG. 4b is another enlarged side view showing a film separation apparatus.

FIGS. 4a, 4b are partially enlarged views of the film separation apparatus, according to the invention, with a pressure unit moved up. In driving the peeling unit 44, first, as shown in FIG. 4, the plungers 82 of the heating unit 80 are retreated into the cylinders 81. As a result, the heat press units 83 come off from the release tape 3, which thus comes into slight contact with the surface protective film 110 of the wafer 120 except for the heating points 85. Then, the peeling unit 44 is slid rightward in FIG. 4a, and the surface protective film 110 attached on the wafer front surface is peeled off and moved upward. As described above, the adhesion between the release tape 3 and the surface protective film 110 is increased at the heating points 85, and this adhesion is larger than that between the surface protective film 110 and the wafer 120. As a result, the heating points 85 function as separation starting points, and the surface protective film 110 is peeled off from the wafer 120. On the other hand, upon the leftward movement of the peeling unit 44 (when the rotation of the rollers 45 is locked), the guide rollers 47 freely rotate and the release tape 3 is fed leftward. Then, the next release tape is pulled out while at the same time taking up the separated surface protective film upward together with the release tape. With the take-up of the release tape 3, the surface protective film 110 is taken up on the take-up unit 43 together with the release tape 3.

As described above, according to this invention, portions with an increased adhesion can be formed between the release tape 3 and the surface protective film 110 by heating the release tape 3 using the heating unit 80. Specifically, according to this invention, even in the case where the surface protective film 110 is of a specific type or subjected to a specific process after being attached and it is difficult to attach the release tape 3 on the surface protective film 110, the release tape 3 can be easily attached by forming the portions having an increased adhesion.

Also, according to this invention, the heating points 85 are formed only at the edge portions of the wafer 120 by the heat press unit 83. As compared with the case in which the whole release tape 3 on the wafer 120 is heated, therefore, the energy required for heating is reduced.

Figure 12:
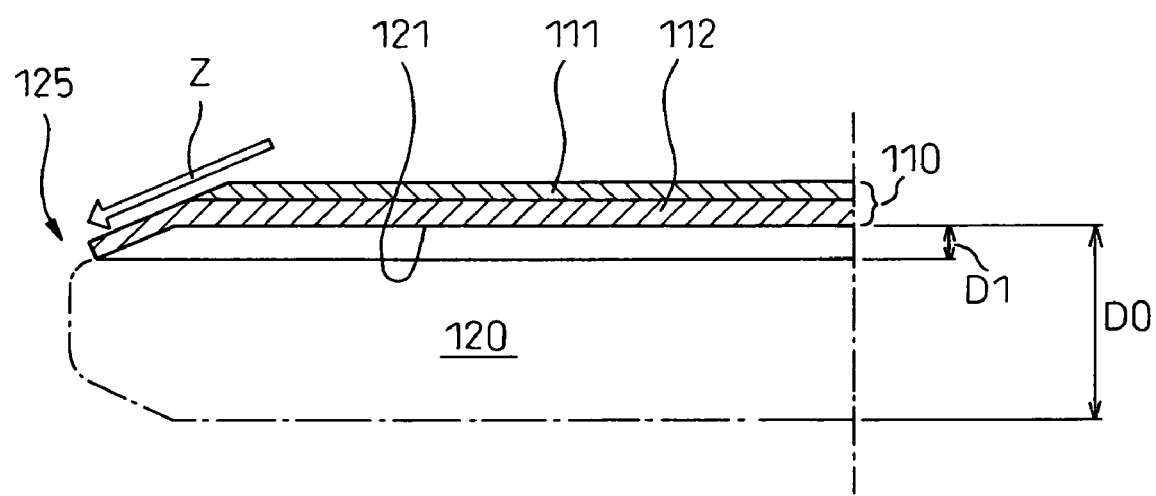
FIG. 12 is an enlarged sectional view of a wafer with a surface protective film attached thereon.

Further, in the case where the surface protective film 110 is cut along the chamfered portion of the wafer as described with reference to FIG. 12, the protective film adhesive layer 112 of the surface protective film 110 remains at the chamfered portion and may be difficult to peel off. According to this invention, however, the portions having a higher adhesion are formed by the heating unit 80 even in such a case and, using the particular portions as a separation starting point, the release tape 3 can be easily separated from the wafer together with the surface protective film 110.

Figure 3B:
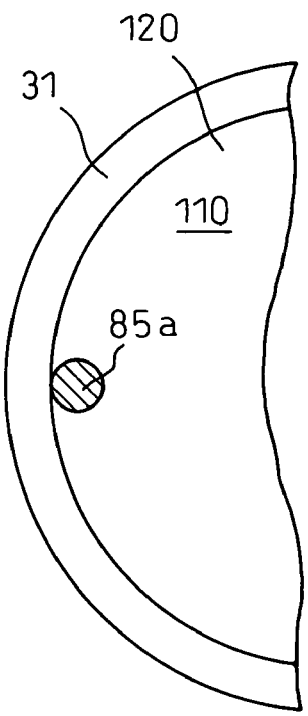
FIG. 3b is another plan view of a wafer indicating a heating point.
Figure 3C:
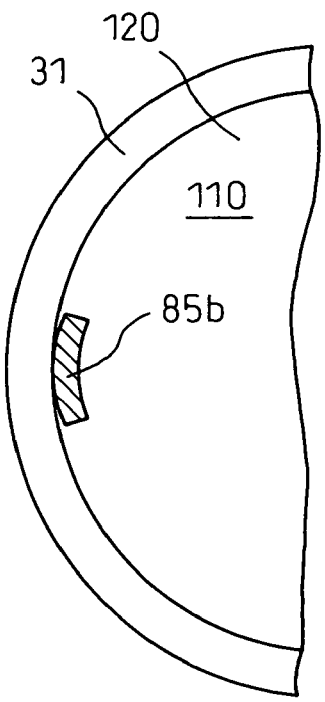
FIG. 3c is still another plan view of a wafer indicating a heating point.

In view of the fact that the heat press units 83 having a rectangular cross section are used in FIG. 3a, the heating points 85 fail to coincide with a part of the edge portions of the wafer 120. It is preferable to use the heat press units 83 in a shape substantially coinciding with the edge portions of the wafer 120. FIG. 3b shows, for example, the heating points 85a formed by the heat press units 83 having a circular cross section. Also, FIG. 3c shows the heating points 85b formed by the heat press units 83 having a arcuate cross section. The radius of the arc of the arcuate portions is preferably equal to the radius of the wafer 120. For the purpose of simplification, the release tape 3 is not shown in FIGS. 3b, 3c.

As shown in these drawings, the arcuate portions of the heating points 85a, 85b are formed at the edge portions of the wafer 120. In such cases, the part of the release tape 3 without surface protective film 110 is prevented from being heated. In other words, the heating points 85a, 85b can be formed at the edge portions of the wafer 120 without heating unrequired portions.

Although the two cylinders 81 and the related heat press units 83 are shown in FIG. 2, etc., the cylinder 81, etc. nearer to the take-up unit 43 may be omitted.

Figure 5A:
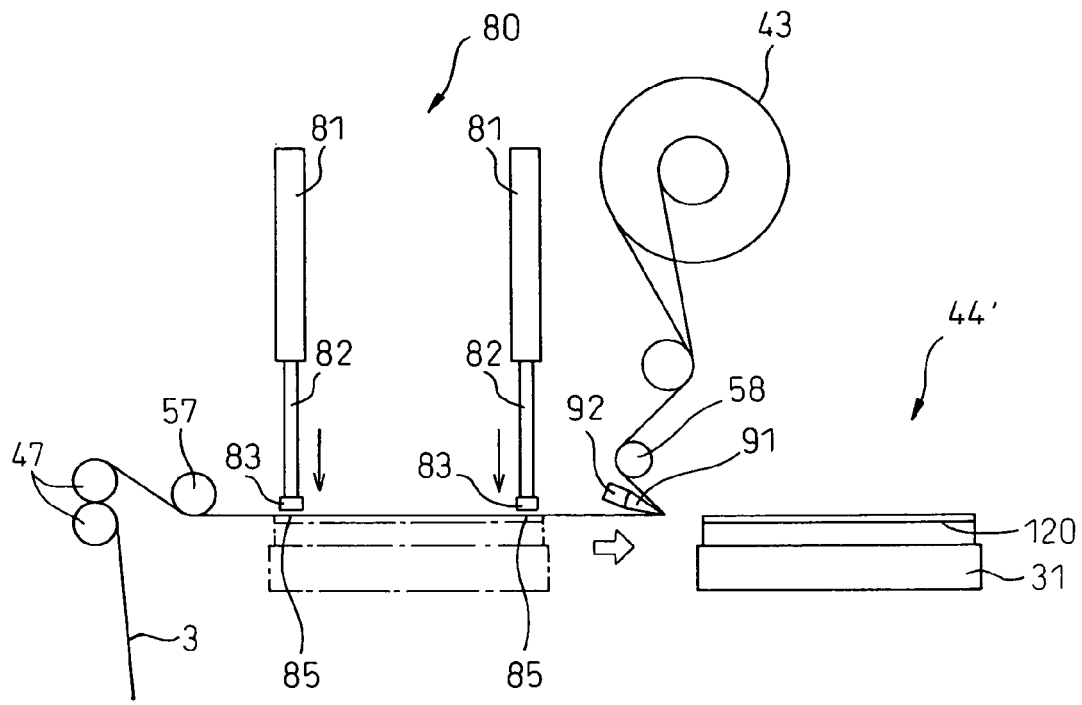
FIG. 5a is a side view showing a film separation apparatus according to a second embodiment of the invention.

FIG. 5a is a side view showing the film separation apparatus according to a second embodiment of the invention. A peeling unit 44' in FIG. 5a includes a peeling bar 91 extending in the direction perpendicular to the release tape 3 downstream of the heating unit 80. The peeling bar 91 is a bar-like member having a substantially triangular cross section and also called an edge member. The length of the peeling bar 91 is larger than the width of the release tape 3. Also, a support rod 92 for supporting the peeling bar 91 integrally supports the rear surface of the peeling bar 91. As shown in FIG. 5a, the release tape 3 is arranged in such a manner as to be folded at the forward end side of the peeling bar 91 corresponding to the apex of the triangular cross section. The forward end side of the peeling bar 91 is located at a slightly higher position than the surface protective film 110 of the wafer 120 by other guide rollers not shown. Also, guide rollers 57, 58 are arranged upstream of the heating unit 80 and the downstream of the peeling bar 91, respectively.

According to this embodiment, the adsorption table 31 is moved up to the release tape 3, and the heating unit 80 is actuated with the release tape 3 and the surface protective film 110 in slight contact with each other as described above. Then, the plungers 82 are extended whereby the heat press units 83 heat by pressing the release tape 3 against the surface protective film 110.

Figure 5B:
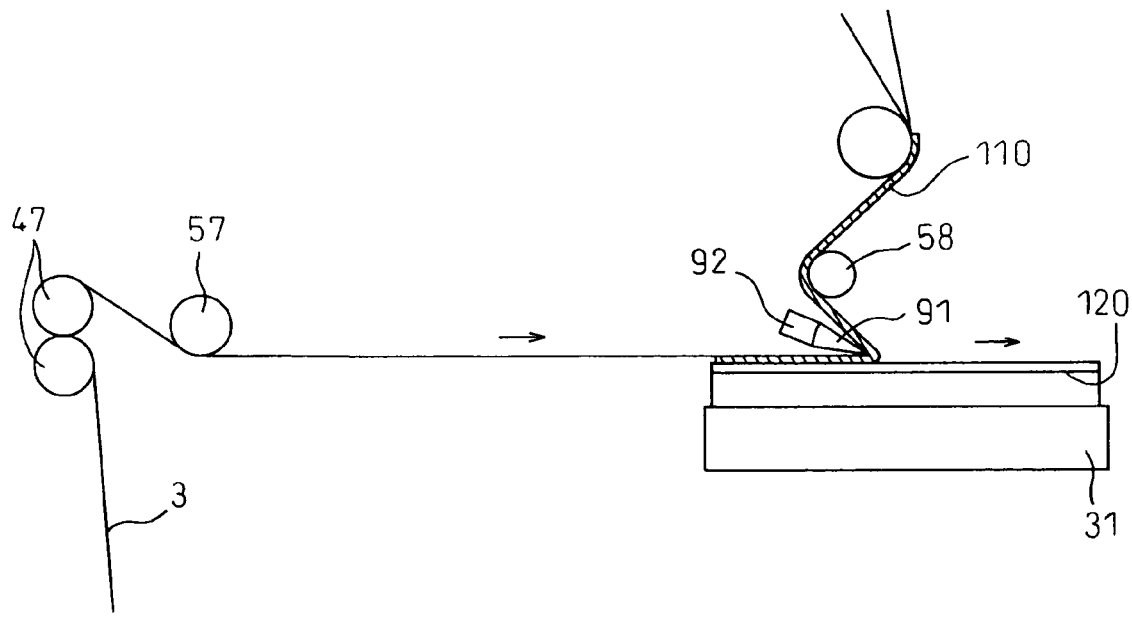

Next, the plungers 82 of the heating unit 80 are retreated, and the heat press units 83 are moved away from the release tape 3. After forming the heating points 85 as described above, the adsorption table 31 is moved in the horizontal direction as shown and passes the peeling bar 91. As described above, the peeling bar 91 is located at a slightly higher position than the surface protective film 110 of the wafer 120 and, therefore, the surface protective film 110 is out of contact with the peeling bar 91. As a result, the heating point 85 described above functions as separation starting points, and the surface protective film 110 is separated similarly from the wafer 120. In this case, as shown in the partly enlarged view of FIG. 5b indicating the operating condition of the tape separation apparatus of FIG. 5a, the surface protective film 110 is separated from the wafer 120 by the peeling bar 91 together with the release tape 3, and then taken up, rightward in FIG. 5b, by the take-up unit 43. This second embodiment produces similar effects to the first embodiment described above. Incidentally, according to the second embodiment, the operation of the peeling bar 91 pressing the wafer 120 may be omitted.

Figure 6A:
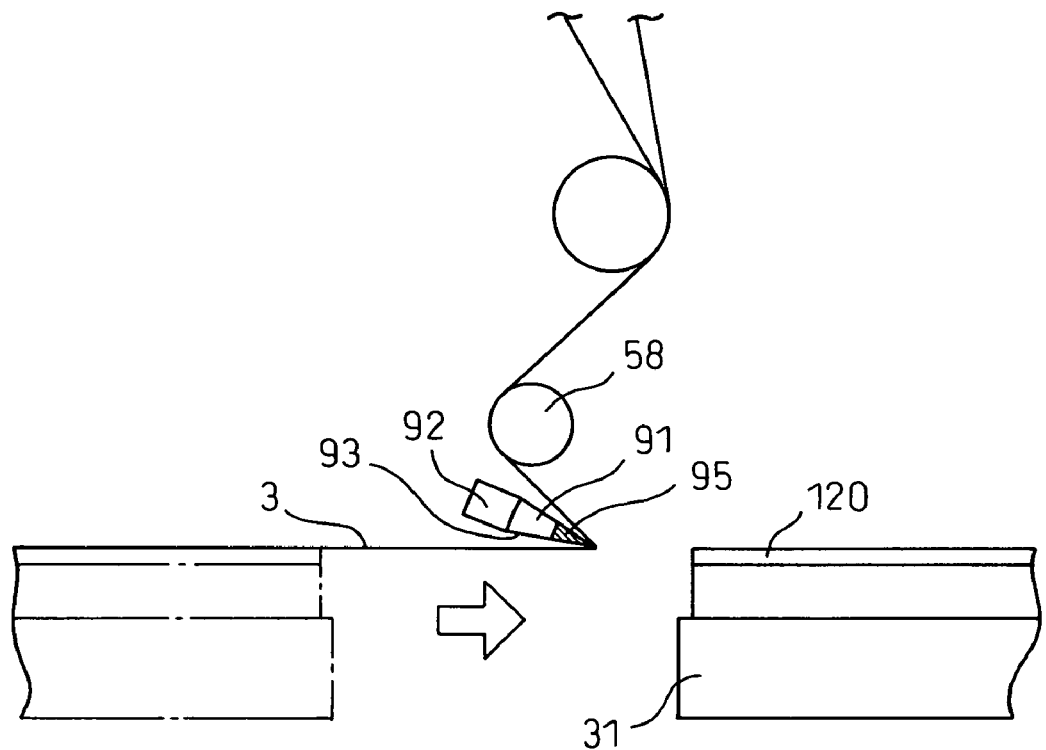
FIG. 6a is a side view showing a film separation apparatus according to a third embodiment of the invention.

FIG. 6a is a side view showing a film separation apparatus according to a third embodiment of the invention. The third embodiment, though substantially similar in configuration to the second embodiment, is different from the second embodiment in that the heating unit 80 including the heat press units 83 is eliminated. In place of the heating unit 80, according to the third embodiment, the lower contact surface 93 of the peeling bar 91 at least partially includes a heating surface 95. The heat of an electrically heated wire (not shown) built in the peeling bar 91 is transmitted to the heating surface 95, so that the heating surface 95 can be heated to a temperature of, say, about 100° C. required for the release tape 3 to exhibit a bonding power. For this reason, the heat conductivity of the material of the heating surface 95 is preferably higher than that of the peeling bar 91. According to the third embodiment, in which the heating unit 80 is not required as described above, the structure of the separation unit 100 can be simplified while at the same time reducing the size of the separation unit 100 as a whole. Also, according to an embodiment not shown, the whole lower contact surface 93 of the peeling bar 91 may constitute a heating surface.

Figure 6B:
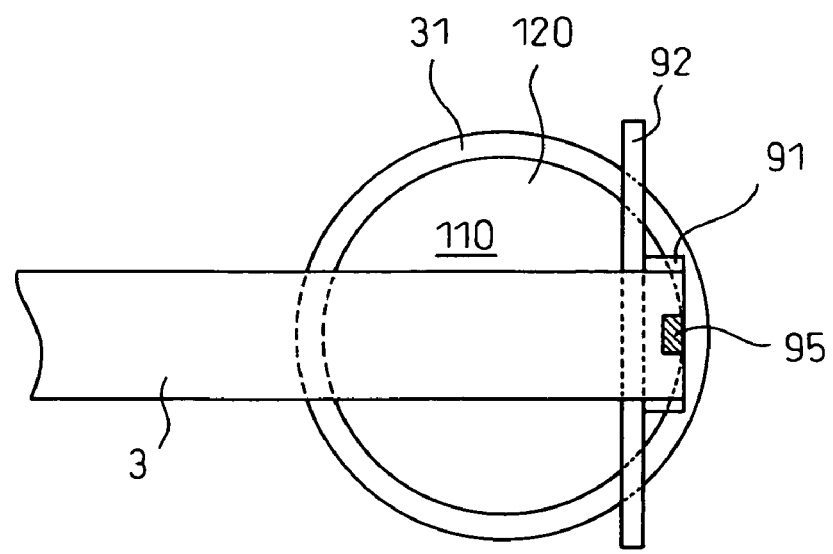

As shown in FIG. 6b which is a partial plan view of the film separation apparatus shown in FIG. 6a, the heating surface 95 is arranged at about the longitudinal center of the peeling bar 91. In operation, therefore, the heating surface 95 is located substantially along the center line of the release tape 3. Incidentally, the heating surface 95 is preferably smaller than the width of the release tape 3.

The adsorption table 31 is provisionally stopped, at the edge portion of the wafer 120 during the passage thereof, at the peeling bar 91. As a result, the release tape 3 is heated and pressed against the surface protective film 110 by the heating surface 95 of the peeling bar 91, thereby partly increasing the adhesion between the release tape 3 and the surface protective film 110. As in the embodiments described above, therefore, this portion functions as a separation starting point, so that the surface protective film 110 is similarly separated from the wafer 120. In other words, it is apparent that the third embodiment produces a similar effect to the aforementioned embodiments.

Figure 7:
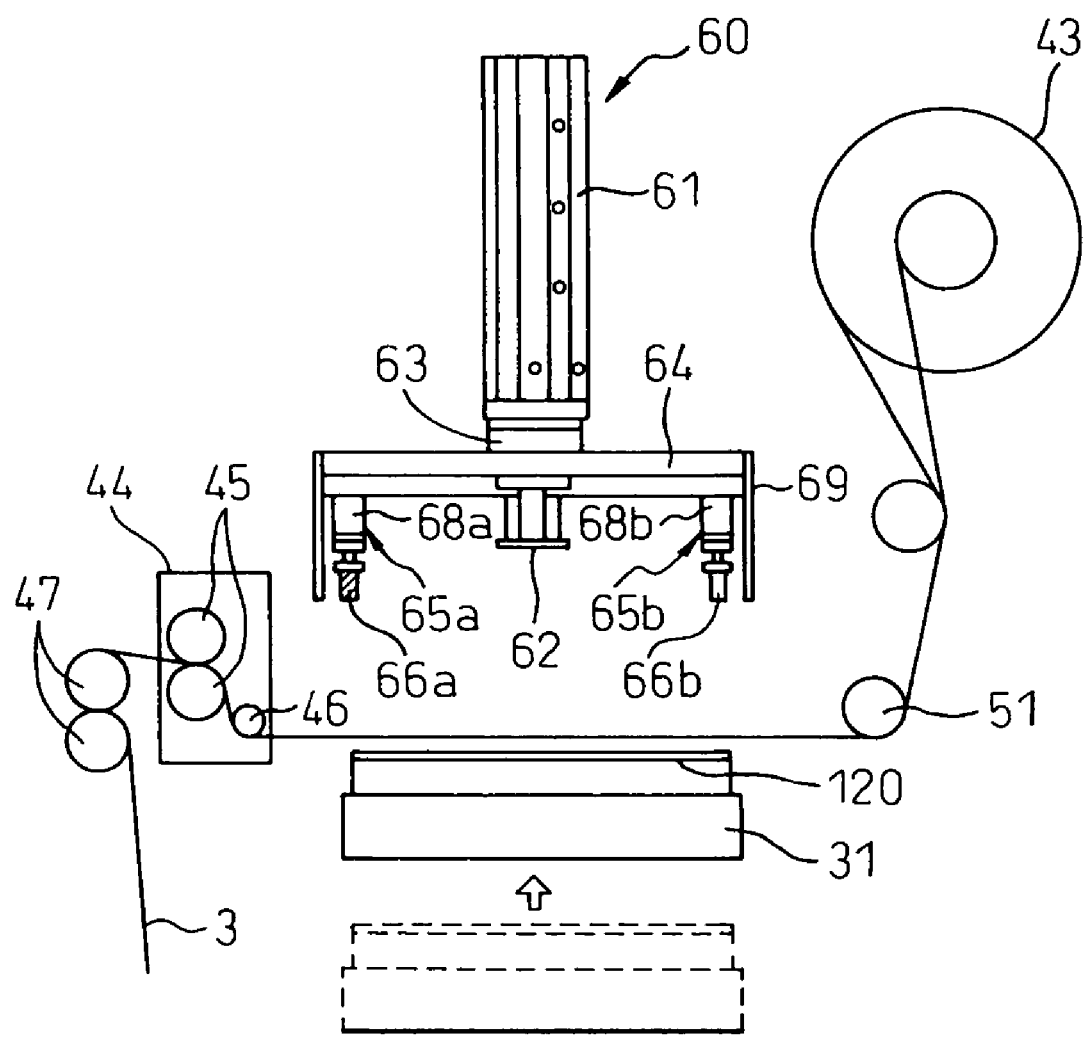
FIG. 7 is a side view showing a film separation apparatus according to a fourth embodiment of the invention.

FIG. 7 is a side view showing a film separation apparatus according to a fourth embodiment of the invention. In FIG. 7, a heat press unit 60 is arranged above the adsorption table 31. The heat press unit 60 includes a casing 61 in which a vertically movable rod 62 is inserted. Only the neighborhood of the forward end portion of the rod 62 is shown in FIG. 7. In FIG. 7, most of the portion of the rod 62 shown is inserted into the casing 61. The rod 62 is connected to an actuator, not shown, and is adapted to move up or down in accordance with the operation of the actuator while at the same time rotating at a predetermined level.

Further, as understood from FIG. 7, a disk 64 is coupled to the neighborhood of the forward end of the rod 62 by a coupler 63. The diameter of the disk 64 is substantially equal to or larger than the diameter of the wafer 120. The disk 64 can be rotated integrally with, or independently of, the rod 62 in response to an instruction from the control unit 89. Further, a cylindrical guide 69 having an inner diameter substantially equal to the diameter of the disk 64 is mounted to extend downward from the edge portion of the disk 64. At least one or, for example, three pressure members 65 are attached to the lower surface of the disk 64. Of these three pressure members, those designated by 65a, 65b shown include extensions 68a, 68b and pressure rollers 66a, 66b mounted at the forward ends of the extensions 68a, 68b, respectively. This is also the case with the remaining pressure member 65c not shown in FIG. 7.

Figure 8:
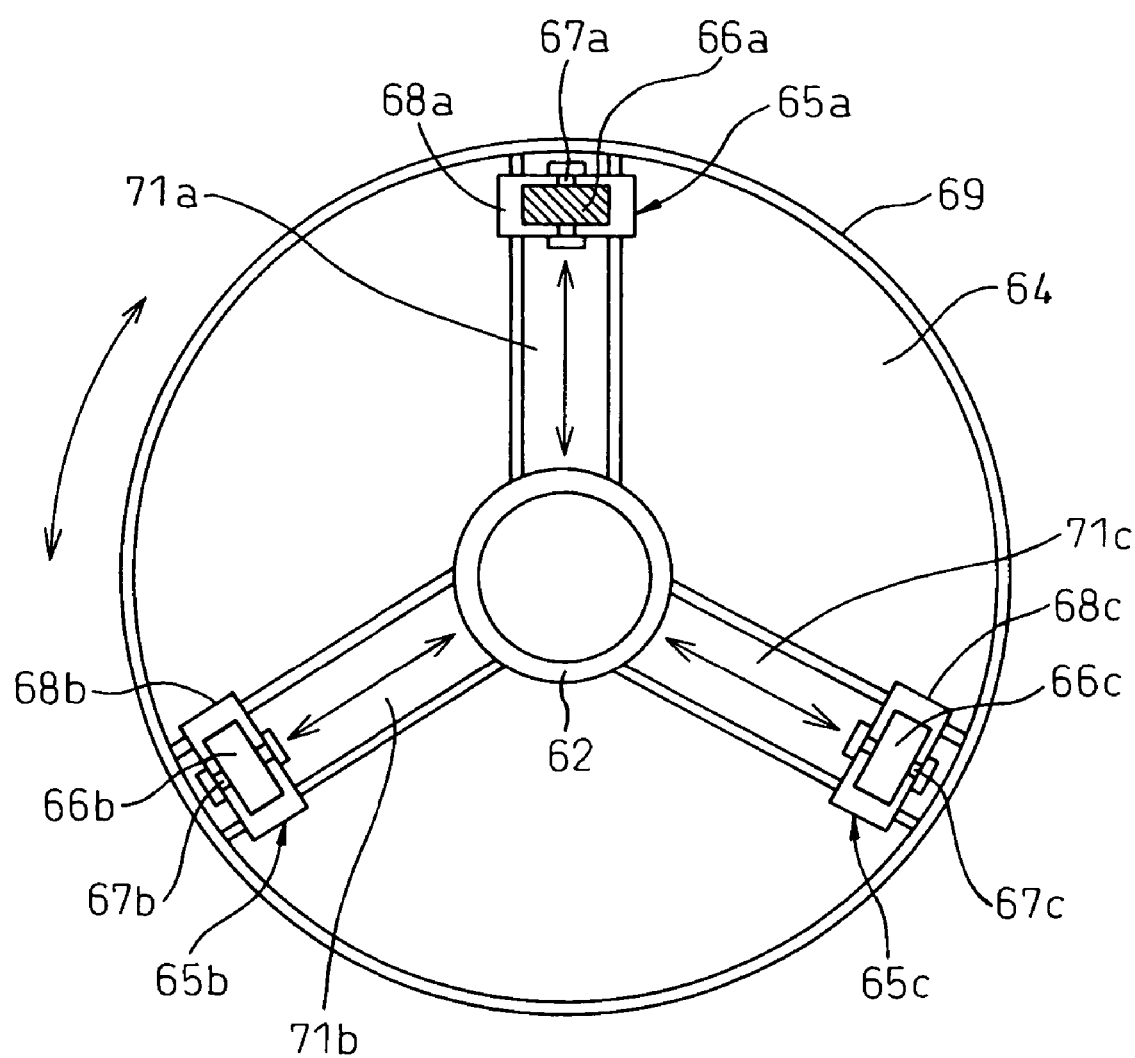
FIG. 8 is a bottom view of a rotatable disk.

FIG. 8 is a bottom view of the rotatable disk. The disk 64 shown in FIG. 8 includes the three pressure members 65a, 65b, 65c. The three pressure members 65a, 65b, 65c are arranged at about the forward end of grooves 71a, 71b, 71c, respectively. Engaging portions (not shown) adapted to engage the grooves 71a, 71b, 71c are arranged at the base ends of the extensions 68a, 68b, 68c of the pressure members 65a, 65b, 65c, respectively. With the engagement between the engaging portions and the grooves 71a, 71b, 71c, respectively, the pressure members 65a, 65b, 65c can be mounted in the grooves 71a, 71b, 71c, respectively. Also, the engaging portions of the extensions 68a, 68b, 68c can slide along the grooves 71a, 71b, 71c, respectively, so that the pressure members 65a, 65b, 65c can be set in position in the grooves 71a, 71b, 71c, respectively. Even in the case where the surface protective film 110 of a wafer 120' different in size is to be separated, therefore, the separation unit 100 according to this invention is readily applicable to the wafer 120' having a different size by adjusting the positions of the pressure members 65a, 65b, 65c.

Also, as can be understood from FIG. 8, the grooves 71a, 71b, 71c are formed at an angle of about 120° from each other. In FIG. 8, therefore, the three pressure members 65a, 65b, 65c are arranged substantially equidistantly on the lower surface of the disk 64. At least one of the distances between arbitrary adjacent ones of the three pressure members 65a, 65b, 65c is assumed to be larger than the width of the release tape 3.

Also, the pressure rollers 66 of the pressure members 65 are mounted with the rotary axes 67 thereof directed radially of the disk 64. Further, the forward end of each pressure roller 66 is located substantially flush with or slightly lower than the forward end of the cylindrical guide 69.

According to a fourth embodiment, an electrically heated wire (not shown) is built in the pressure roller 66a of the pressure member 65a. When in use, the surface of the pressure roller 66a is heated to a temperature of about 100° C., for example, required for the release tape 3 to exhibit a predetermined bonding power.

Figure 9:
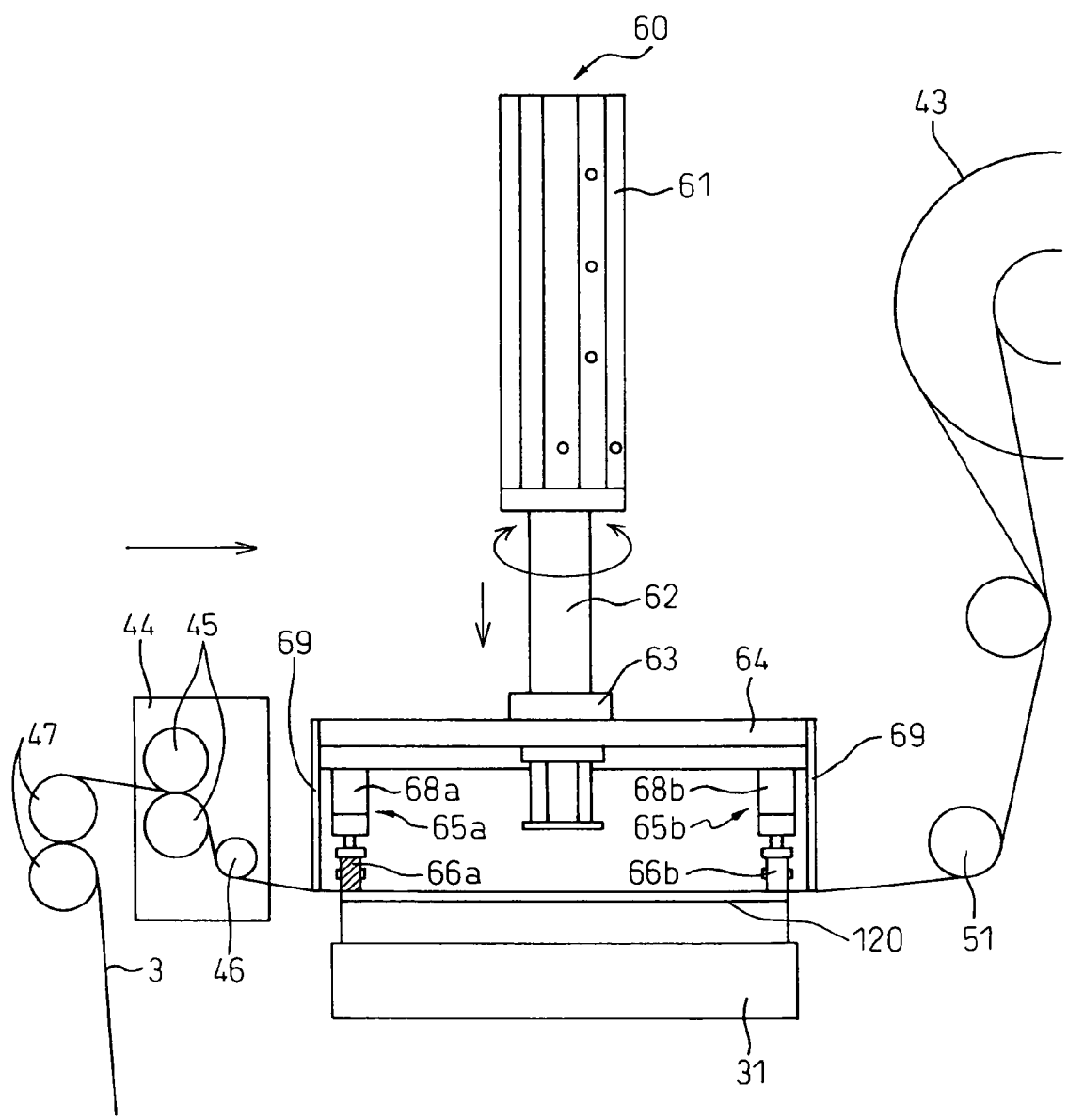
FIG. 9 is a partly enlarged view of a film separation apparatus according to the invention with the heating unit moved down.

FIG. 9 is a partially enlarged view of a film separation apparatus according to the invention with the heat press unit down. As described above, the heat press unit 60 is actuated with the release tape 3 and the surface protective film 110 slightly in contact with each other. By driving an actuator not shown, the rod 62 of the heat press unit 60 is extended downward. The rod 62 is extended by a predetermined length, so that the heat press roller 66a of the pressure member 65 presses the surface protective film 110 via the release tape 3. In the process, as shown in FIG. 9, the forward end of the cylindrical guide 69 comes into contact with the release tape 3 and, therefore, the tension exerted on the release tape at the time of pressing operation can be kept comparatively small.

Figure 10A:
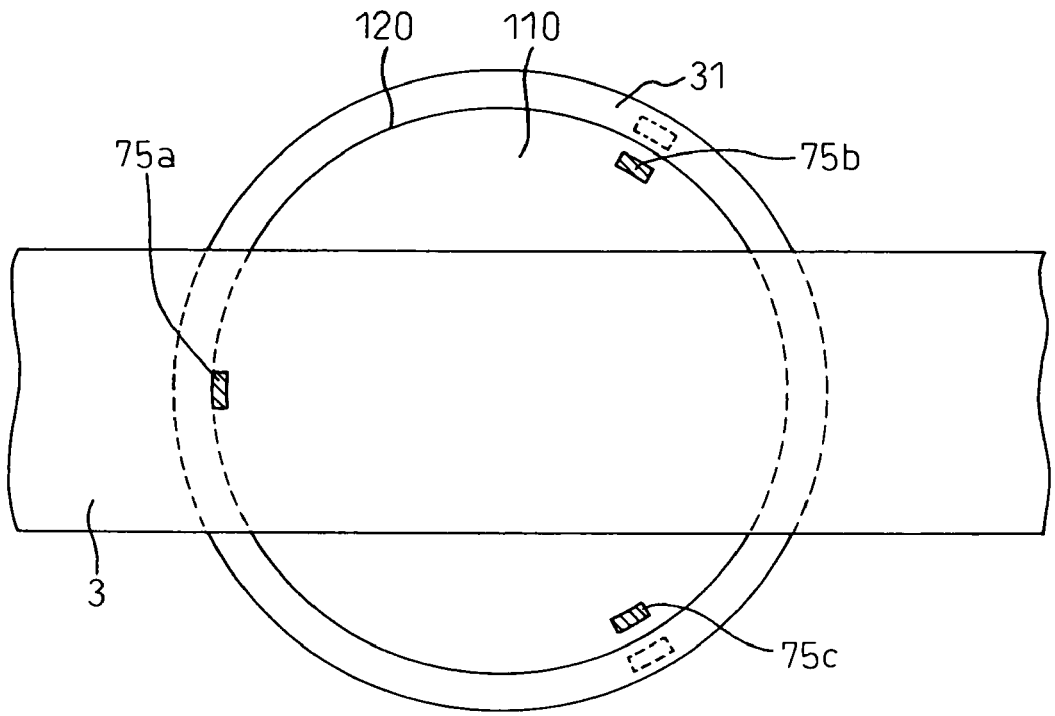
FIG. 10a is a plan view of the wafer showing the heating points formed by the heating member at the time of driving the heating unit.

FIG. 10a is a plan view of a wafer showing the pressure points formed by the pressure members when the heat press unit is driven. In FIG. 10a, the pressure points 75a, 75b, 75c formed by the pressure members 65 are shown in the neighborhood of the edge portion of the wafer 120. Of these three pressure points 75a, 75b, 75c, the pressure point 75a formed is by the pressure roller 66a, like in the embodiment described above, at the edge portion of the wafer 120. The remaining pressure points 75b, 75c are formed on the surface protective film 110 of the wafer 120 where there is no release tape 3. The pressure rollers 66b, 66c have no heating function and are preferably located outside the wafer 120 to not directly press the surface protective film 110.

The pressure point 75a is formed by the pressing operation of the heat press roller 66a and, therefore, has an increased adhesion between the release tape 3 and the surface protective film 110. Specifically, after driving the heat press unit 60, the adhesion between the release tape 3 and the surface protective film 110 at the pressure point 75a is larger than the adhesion between the surface protective film 110 and the wafer 120. The adhesion between the release tape 3 and the surface protective film 110, however, is not larger than the adsorption strength between the wafer 120 and the adsorption table 31. The peeling unit 44 is driven with the adhesion increased in this way between the release tape 3 and the surface protective film 110 at the pressure point 75a. As a result, it is apparent that a similar effect to the foregoing case is obtained.

Figure 10B:
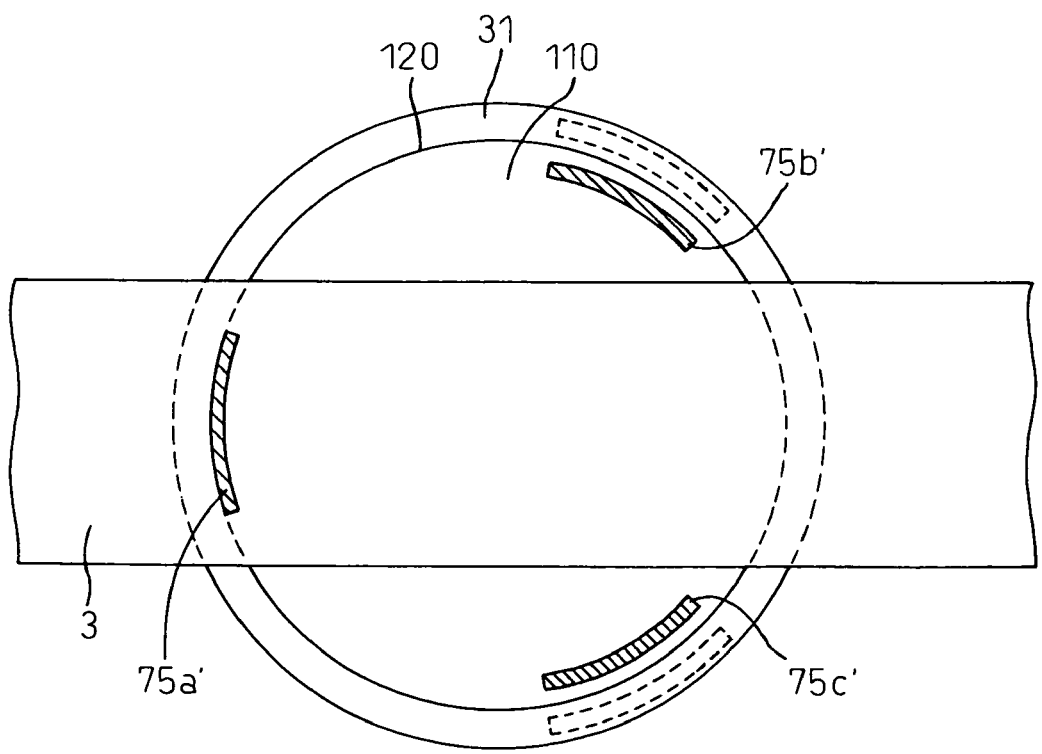
FIG. 10b is a top plan view of a wafer and a release tape showing the locus of the heating points formed by the heating member at the time of the rotation of the disk.

Further, after pressing the pressure member 65a against the surface protective film 110 via the release tape 3, the rod 62 can be rotated together with the disk 64 by a predetermined distance. FIG. 10b is a top plan view of the wafer and the release tape showing the trajectory of the pressure points formed by the pressure member with the disk rotation. As described above, the rotary axes 67a, 67b, 67c of the pressure rollers 66a, 66b, 66c are located on the radius of the disk 64 and, therefore, the pressure points 75a', 75b', 75c' formed by the pressure rollers 66a, 66b, 66c with the integral rotation of the rod 62 and the disk 64 follows an arcuate trajectory. The diameter of the disk 64 is sufficiently larger than the width of the release tape 3. In the case where the rotary axis 67a of the pressure roller 66a is located on the center line of the release tape 3, therefore, the arcuate pressure point 75a' formed on the release tape 3 is directed substantially transversely of the release tape 3. The peeling unit 44 described above moves longitudinally of the release tape 3. In the case where the pressure point 75a' is formed substantially transversely of the release tape 3, therefore, one of the long sides of the pressure point 75a' begins the separation of the surface protective film 110 substantially at one time. Thus, the surface protective film 110 can be separated equally from the wafer 120.

Preferably, the distance corresponding to the chord of the arc of the pressure point 75a' is smaller than the width of the release tape 3 and the pressure point 75a' is located in its entirety within the area of the release tape 3. As a result, the loss of the energy required to form the pressure point 75a' in the area of the release tape 3 when rotating the disk 64 can be reduced.

Also, preferably, the disk 64 shown in FIG. 8 is rotated in one direction and, then, in the opposite direction several times so that the pressure roller 66a is reciprocated only the trajectory of the pressure point 75a'. In such a case, the adhesion between the release tape 3 and the surface protective film 110 at the pressure point 75a' can be increased remarkably as compared with the case where the pressure roller 66a is not reciprocated. Therefore, the action to separate the surface protective film 110 by the release tape 3 can be positively carried out.

Referring again to FIG. 1, upon complete separation of the surface protective film 110 by the separation unit 100, the adsorption table 31 is returned to the positioning unit 300 with the wafer 120 adsorbed thereto, and then the wafer 120 is returned to the inversion unit 300 through a loader not shown. In the process, the surface of the wafer 120 is already directed up, and therefore the wafer 120 is passed through the inversion unit 300 without being inverted and supplied to a recovery unit 500. In the recovery unit 500, the wafer 120 is recovered sequentially into a predetermined cassette. Then, the wafer 120 is supplied to a device such as a dicing unit 2 used in subsequent processes.

Figure 11:
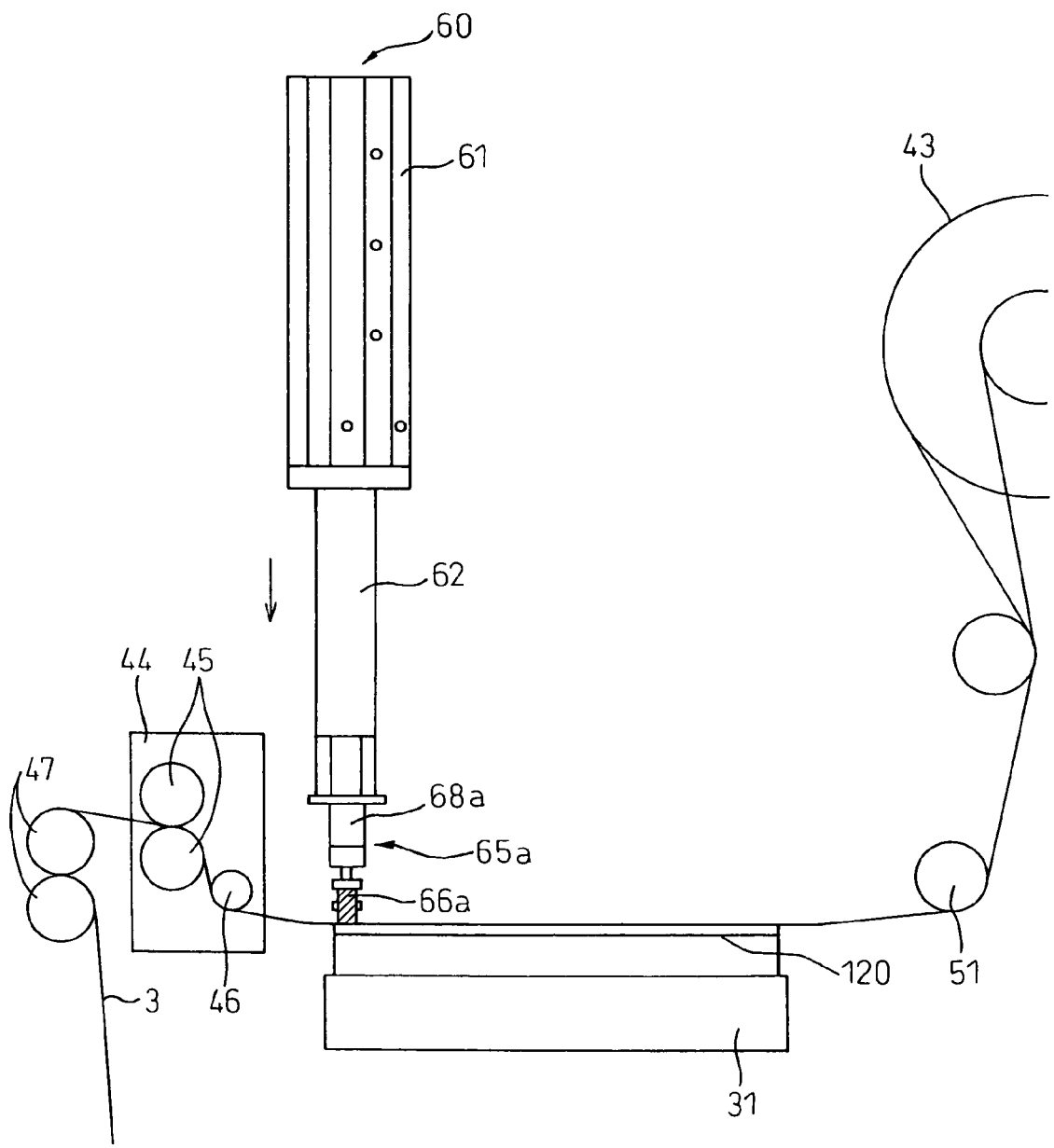
FIG. 11 is a side view showing another film separation apparatus according to the invention having a single pressure roller.

Also, in the case where only the pressure member 65*a* is provided as described above, the separation unit 100 according to the invention is not necessarily equipped with the disk 64. Instead, the pressure member 65*a* is mounted at the forward end of the rod 62, for example, and the pressure roller 66*a* of the pressure member 65*a* may be reciprocated with the release tape 3 is pressed against the surface protective film 110 (See FIG. 11).

In the foregoing embodiments, the release tape 3 is described as a heat sensitive release tape. Even in the case where the release tape 3 is a pressure sensitive release tape, however, the separation unit 100 according to the invention is applicable by making sure that the heat press unit 83, the heating surface 95 and the pressure roller 66*a* have no heating function. Specifically, the separation unit 100 according to this invention is directly applicable to a pressure sensitive release tape by switching off the power supply to the electrically heated wire (not shown) related to the heat press unit 83, etc.

According to an embodiment not shown, the release tape 3 may be formed of only a plastic material without containing an adhesive layer. Specifically, the release tape 3 may be a simple plastic film. The plastic film used in such a case preferably has a comparatively low softening point or melting point lower than, for example, about 100° C. Examples of the plastic film that can be employed include a low-density polyethylene film, polypropylene film, polyvinyl chloride film or polystyrene film. The softening point or the melting point is not necessarily about 100° C. and a plastic film having a softening point or a melting point of not lower than 100° C. may be used as long as a sufficient heat amount to melt the film can be generated.

In such a case, the plastic film is partially melted by pressing and heating the plastic film, in place of the release tape 3, against the surface protective film 110 by the heating unit 80, the heating surface 95 and the pressure roller 66*a*. Due to the foregoing, the adhesion between the melted part of the plastic film and the surface protective film 110 of the wafer 120 is improved. As a result, the surface protective film 110 can be similarly recovered by use of the plastic film. Also in such a case, it is apparent that a similar effect to the above-mentioned one can be obtained. Further, this plastic film has no adhesive layer and, therefore, is less expensive than the pressure or heat sensitive release tape containing an adhesive layer. By using the plastic film in place of the release tape 3, therefore, the running cost of the film separation apparatus can be suppressed.

An appropriate combination of the embodiments described above is of course included in the scope of the invention. It will be understood by those skilled in the art that this invention, described above with reference to typical embodiments, can be modified, otherwise than described above, without departing from the scope of the invention.

The invention claimed is:

1. A film separation apparatus, for separating a film attached to a film application surface of a wafer, comprising:
    a wafer adsorption means for adsorbing the wafer in such a manner that the film application surface of the wafer constitutes an upper surface;
    a release tape supply means for supplying a release tape onto the film on the film application surface;
    a heating means for pressing and heating a portion of the release tape at an edge portion of the wafer against the film to improve adhesion between the release tape and the film at the portion of the release tape, wherein the heating means includes a heat press unit for pressing the release tape against the film and having an arcuate cross section in a plane parallel to the wafer and the arcuate cross section includes an arc with a radius equal to a radius of the wafer; and
    a separation means for separating the film from the film application surface of the wafer by the release tape with said portion of the release tape improved in adhesion as a separation starting point.

2. A film separation apparatus according to claim 1, wherein the separation means includes an edge member brought into contact with the wafer via the release tape.

3. A film separation apparatus according to claim 1, wherein the separation means includes an edge member brought into contact with the wafer via the release tape, and the heating means is located at the edge member of the separation member.

4. A film separation apparatus according to claim 1, wherein the heating means includes a pressure roller configured to heat the release tape and to move substantially transversely on the release tape, and wherein the portion of the release tape is heated by the pressure roller moving over the portion.

5. A film separation apparatus according to claim 4, wherein the heating means includes a rotatable disk and a plurality of the pressure rollers are mounted on a lower surface of the rotatable disk in such a manner that rotational axes of the pressure rollers are located on a radius of the rotatable disk, and wherein the pressure rollers are configured to rotationally move along an arc on the release tape at the time of rotation of the rotatable disk.

6. A film separation method for separating a film attached on a film application surface of a wafer comprising:
    arranging the wafer on a wafer adsorption means in such a manner that the film application surface of the wafer constitutes an upper surface;
    supplying the release tape onto the film on the film application surface;
    heating a portion of the release tape against the film of the wafer;
    pressing the release tape against the film to increase adhesion between the release tape and the film at the portion of the release tape by a heat press unit having an arcuate cross section in a plane parallel to the wafer, wherein the arcuate cross section includes an arc with a radius equal to a radius of the wafer; and
    separating the film from the film application surface of the wafer using the release tape with said portion of the release tape, having an improved adhesion, as a separation starting point.

7. A film separation method according to claim 6, wherein the release tape is formed by a plastic material.

8. A film separation method according to claim 7, wherein the plastic material is formed by one or more of the group consisting of polyethylene, polypropylene, polyvinyl chloride and polystyrene.

\* \* \* \* \*